United States Patent
West

(10) Patent No.: US 7,336,066 B2
(45) Date of Patent: Feb. 26, 2008

(54) REDUCED PIN COUNT TEST METHOD AND APPARATUS

(75) Inventor: Burnell G. West, Half Moon Bay, CA (US)

(73) Assignee: Credence Systems Corporation, Milpitas, CA (US)

(*) Notice: Subject to any disclaimer, the term of this patent is extended or adjusted under 35 U.S.C. 154(b) by 0 days.

(21) Appl. No.: 10/851,454

(22) Filed: May 21, 2004

(65) Prior Publication Data

US 2005/0258818 A1 Nov. 24, 2005

(51) Int. Cl.
*G01R 31/02* (2006.01)
*G01R 31/28* (2006.01)

(52) U.S. Cl. .................... 324/158.1; 324/765

(58) Field of Classification Search ............. 324/765, 324/754, 158.1, 72.5; 714/720, 719, 724; 702/121, 123
See application file for complete search history.

(56) References Cited

U.S. PATENT DOCUMENTS

| | | | | |
|---|---|---|---|---|
| 4,754,477 | A * | 6/1988 | Tanaka et al. | 379/165 |
| 6,157,200 | A * | 12/2000 | Okayasu | 324/753 |
| 6,411,117 | B1 * | 6/2002 | Hatamian | 324/765 |
| 6,466,007 | B1 * | 10/2002 | Prazeres da Costa et al. | 324/158.1 |
| 6,642,707 | B1 * | 11/2003 | Iorga et al. | 324/158.1 |
| 6,727,723 | B2 * | 4/2004 | Shimizu et al. | 324/765 |
| 6,783,078 | B1 * | 8/2004 | Leaming | 235/492 |
| 2002/0041190 | A1 * | 4/2002 | Hashimoto | 324/765 |
| 2002/0196029 | A1 * | 12/2002 | Schmidt | 324/500 |
| 2004/0187049 | A1 | 9/2004 | West | |

OTHER PUBLICATIONS

U.S. Appl. No. 10/824,703, filed Apr. 14, 2004, West et al.
U.S. Appl. No. 10/825,409, filed Apr. 14, 2004, West et al.
Evelina Yeung et al. "A 2.4 Gb/s/pin Simultaneous Bidirectional Parallel Link with Par-Pin Skew Compensation" *IEEE Journal of Solid-State Circuits*. Nov. 2000. vol. 35 (11): 1619-1628.
Burnell G. West. "Simultaneous Bidirectional Test Data Flow for a Low-Cost Wafer Test Strategy" *IEEE ITC International Test Conference*. Aug. 2003. Paper 36.3: 947-951.

* cited by examiner

*Primary Examiner*—Ernest Karlsen

(57) ABSTRACT

Testing of an electronic device is carried out by combining power and signal delivery on a single pair of wires. The power delivery is decoupled from the signal delivery, using inductors, so the device power supplied does not interfere with the test signals delivered from the device and the response signals delivered to the device. Further, simultaneous bidirectional signal paths are decoupled, using capacitors, so that the tester transceiver and the device transceiver are not damaged by the power delivered to the device on the same wires. A common fixture may be used to test a number of different types of wafers, independent of the topography, size, or power requirements of the devices on the wafers, resulting in a significant cost saving, because fixture design has become very expensive, in some cases costing more than the tester whose signals it is implemented to deliver.

17 Claims, 7 Drawing Sheets

REDUCED PIN COUNT TEST METHOD AND APPARATUS

BACKGROUND OF THE INVENTION

1. Field of the Invention

The present invention relates to electronic device testing, and more particularly to integrated circuit (IC) testing using few device pins.

2. Description of the Related Art

Reduced pin count testing of electronic devices has been implemented in various ways. One way is to incorporate built-in self test (BIST) circuits into the device design. During testing, the BIST circuit translates incoming signals on a few pins into tests required to test and diagnose the device under test (DUT) and returns response signals containing test results.

Another way is to employ simultaneous bidirectional signaling (SBS) to combine the input to the DUT and the output from the DUT on a single line. This technique is described in a commonly owned application entitled, "A Very Small Pin Count IC Tester," Ser. No. 10/376,025, filed Feb. 27, 2003, the entire contents of which are incorporated by reference herein. The use of SBS allows a single line to be used simultaneously for both input and output for the DUT. Hence, the time required for the test as well as the number of pins involved with the test are reduced.

Even with these reductions in the pin count and the resulting increase in the parallelism of the testing and decrease in the overall cost of testing multiple devices on a wafer, testing still remains very expensive.

SUMMARY OF THE INVENTION

An object of the invention is to provide a reduced pin count or, more generally, reduced connection count, test method and apparatus that reduces the overall cost of testing electronic devices, in particular those electronic devices that employ high-speed differential serial data streams for signaling.

The above object is achieved by employing simultaneous bidirectional signaling for test and response signals and combining device power and signal delivery on a single pair of wires. The power delivery is decoupled from the signal delivery, using inductors, so the device power supplied does not interfere with the test signals delivered from the device and the response signals delivered to the device. Further, SBS paths are decoupled, using capacitors, so that the tester transceiver and the device transceiver are not damaged by the power delivered to the device on the same wires.

The invention may be applied to testing of wafers having bump arrays that are uniform. It is noted that many wafers already have uniform bump arrays, because a specific bump pattern is required for each type of device that is formed on a wafer, and a plurality of identical devices are fabricated on a single wafer.

As will be described in more detail below, a common fixture may be used for a number of different types of wafers, independent of the topography, size, or power requirements of the devices on the wafers. The one requirement for using a common fixture is that the bumps on the tested wafer must be applied in view of the common fixture's layout so that they are aligned with the output lines on the fixture and connect to all of the signal circuits and power grids that are used in testing the ICs on the wafer.

ICs with a limited number of bumps may be designed with one test circuit and one power grid connected to a single pair of bumps. During testing of a wafer containing these ICs, power and signal delivery for each of the ICs are combined on a single pair of wires.

Larger ICs generally have higher power requirements and are designed with more than one power grid. However, they have a greater number of bumps, so the power and signal delivery need not be combined on a single pair of wires. Therefore, in general, each of the test circuits and power grids of larger ICs has connections to a different pair of bumps, such that during testing, only power is transmitted over some pairs of bumps and only test/response signals are transmitted over some pairs of bumps. When there are more bumps aligned with the output lines on the fixture than necessary, neither power nor test/response signals are transmitted over these bumps.

In accordance with the invention, connection count needed for testing is reduced. Furthermore, by taking advantage of the regularity of the device bump array on a wafer, wafers having ICs of different sizes and power requirements may be tested using a common fixture. This represents a significant cost saving, because very high connection count fixtures have become very expensive, in some cases costing more than the tester whose signals it is implemented to deliver.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

The present invention provides a system and method for testing electronic devices such as ICs. The invention is particularly useful in testing ICs with bump arrays. However, the invention reduces the number of connections between a tester and a DUT, regardless of the type of device being tested, and is applicable to other types of ICs.

Figure 1:
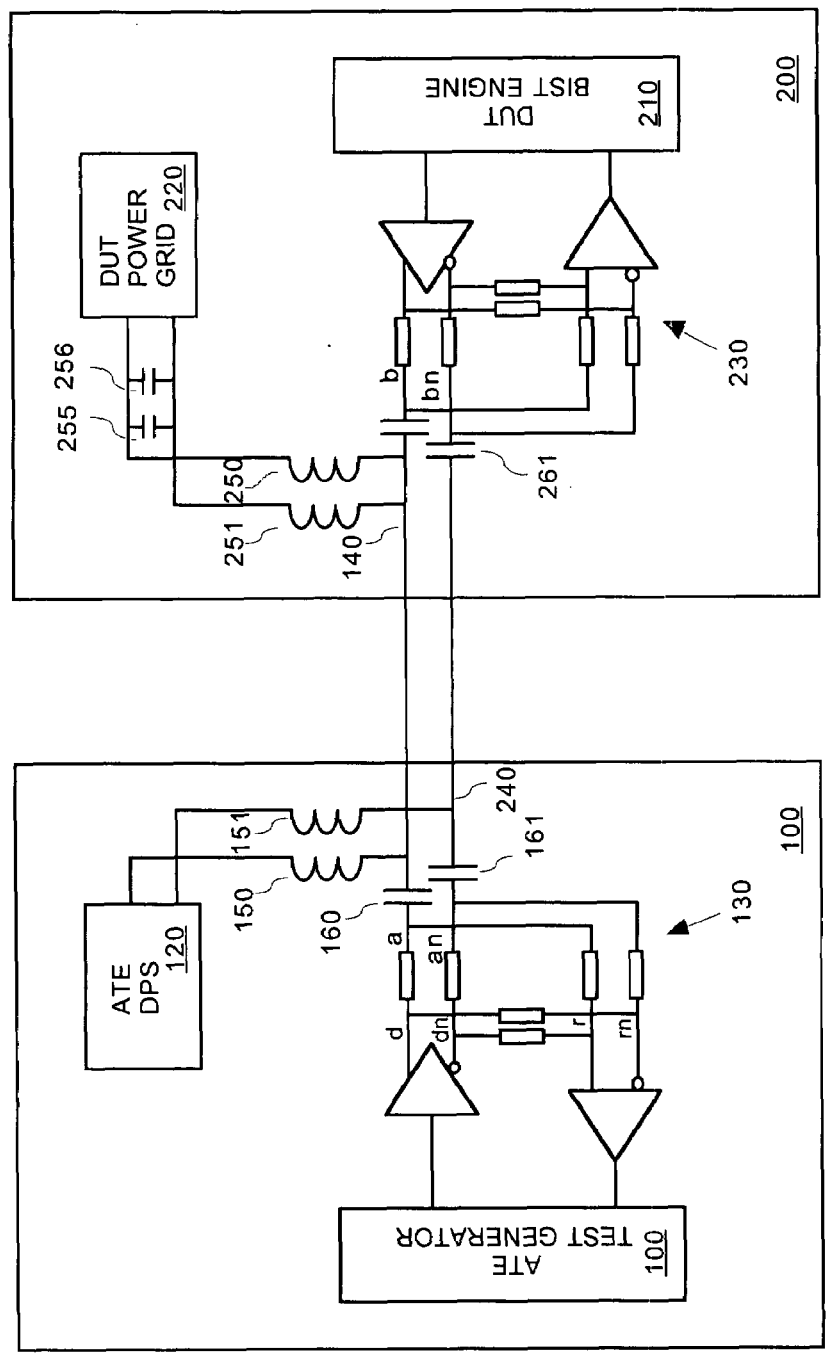
FIG. 1 is a block diagram showing a simplified version of the circuit design used in the invention.

FIG. 1 is a block diagram showing a simplified circuit design used in the invention. The left side of FIG. 1 shows circuit elements contained in the tester 100 and the right side of FIG. 1 shows circuit elements contained in the DUT 200.

The tester 100 includes a test generator 110, a DC power supply 120, and a differential transceiver 130 that is connected to a pair of wires 140, 240. The DUT 200 includes a BIST engine 210, a power grid 220, and a differential transceiver 230 that is connected to the pair of wires 140, 240.

The transceiver 130 of the tester 100 and the transceiver 230 of the DUT 200, connected to each other through the pair of wires 140, 240, constitute simultaneous bidirectional signal transceivers. They are configured to transmit self-timed high-speed differential serial data streams in both directions over the wires 140, 240. The use of simultaneous bidirectional signal paths embodying self-timed high-speed differential serial data streams are known in the art and are described in "A 2.4 GBPS Simultaneous Bidirectional Parallel Link with Per Pin Skew Compensation," Proceedings of ISSCC (2000), the contents of which are incorporated by reference herein. In response to instructions from the test generator 110, which keeps track of the test information that is required to enable the BIST engine 230, the transceivers 130, 230 generate signals necessary to transmit a data packet or a series of data packets containing the required test information for enabling the BIST engine 230. The BIST engine 230 receives the data packets, extracts the test information, and executes the test. The results of the test are then packaged by the BIST engine 230 and transmitted to the ATE 100 over the same wires 140, 240.

The current provided by the power supply 120 to the DUT 200 flows over the same wires that are used for simultaneous bidirectional signaling. As shown in FIG. 1, the power supply 120 is connected to the wires 140, 240 and the power grid 220 is connected to the wires 140, 240, so that power is supplied from the power supply 120 to the power grid 220 over the wires 140, 240. Power is decoupled from the test signals transmitted over the wires 140, 240 by inductors. Inductors 150, 151 decouple the power supply 120 from the test signals transmitted over the wires 140, 240, and inductors 250, 251 decouple the power grid 220 from the test signals transmitted over the wires 140, 240. Local bypass capacitors 255, 256 are connected in parallel between the two wires that connect to the power grid 220. The bypass capacitors 255, 256, together with the inductors 250, 251, provide a low-pass filter that keeps the DUT power at the proper level.

Capacitors 160, 161 are provided to decouple the transceiver 130 from the DC power voltages being supplied to the power grid 220, and capacitors 260, 261 are provided to decouple the transceiver 230 from the DC power voltages being supplied to the power grid 220. By blocking the DC power voltages being supplied to the power grid 220, the capacitors 160, 161, 260, 261 allow the input signals to the DUT 200 and output signals from the DUT 200 to be set on average DC levels appropriate to the specific simultaneous bidirectional signal levels required by the specific DUT design, and prevent damage to the transceivers 130, 230 by DC voltages that are outside the tolerance of these signal circuits.

Figure 2:
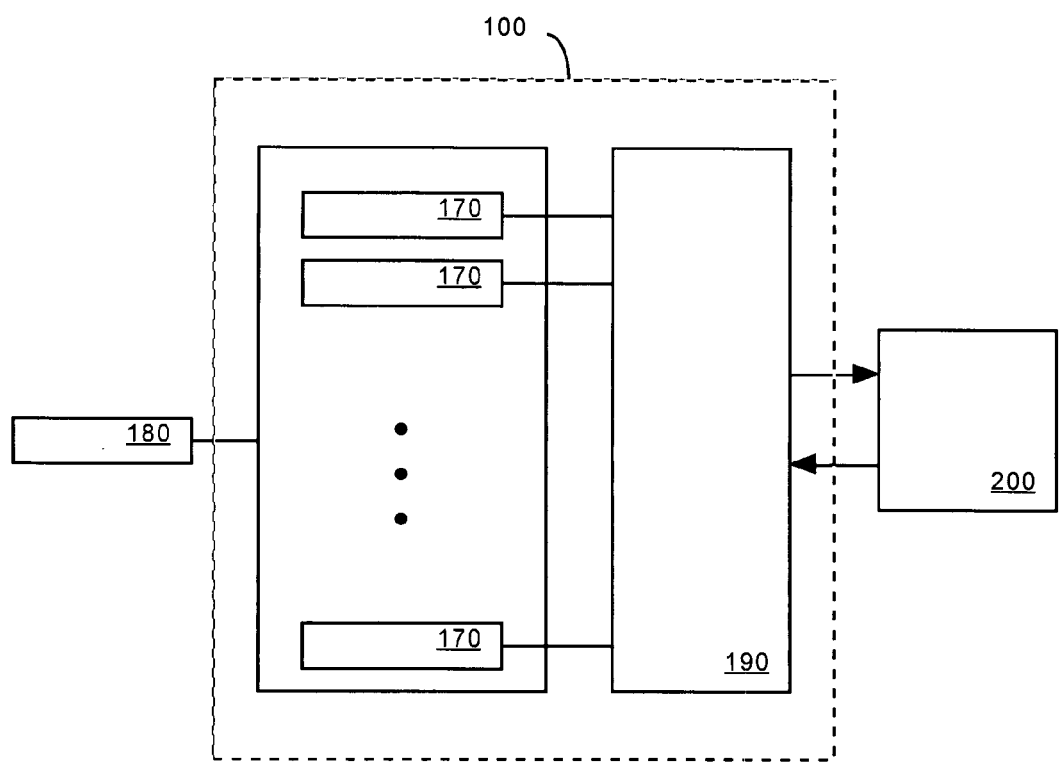
FIG. 2 is a block diagram of a tester and a DUT in which the circuit design of FIG. 1 is incorporated.

FIG. 2 is a block diagram of the tester 100 and the DUT 200 in which the circuit design of FIG. 1 is incorporated. The tester includes a number of test instruments 170, including analog test instruments and digital test instruments, that operate under the control of software, e.g., a test program 180 and a fixture 190, which is commonly known as a loadboard. The fixture 190 is connected to the DUT 200 by a single pair of wires. As shown in FIG. 1, this single pair of wires is used for simultaneous bidirectional signaling as well as for supplying power to the DUT 200.

Figure 3:
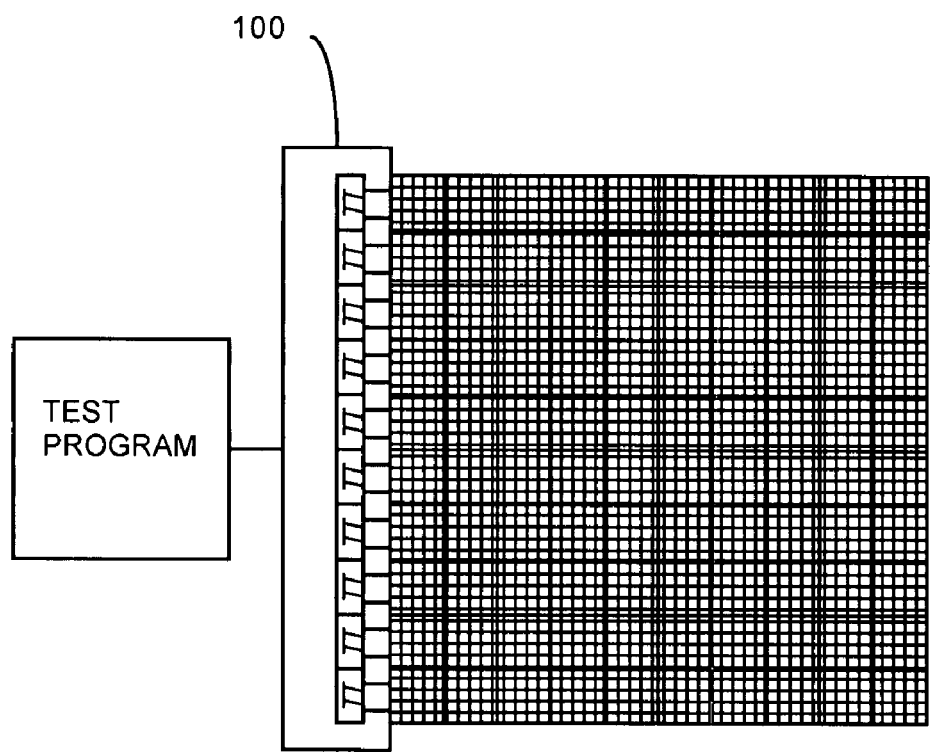
FIG. 3 shows the connections between a tester and a wafer having multiple DUTs, each of which is connected to the tester by a single pair of wires.
Figure 4:
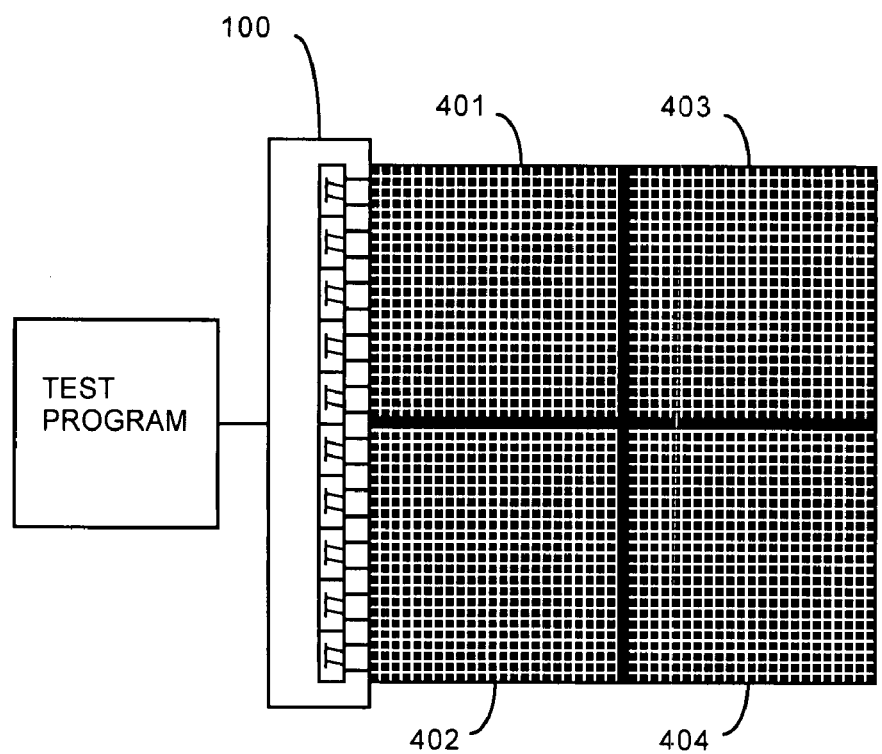
FIG. 4 shows the connections between a tester and a wafer having multiple DUTs, each of which is connected to the tester by multiple pairs of wires.

FIGS. 3 and 4 show small areas of wafers containing ICs of two different types. The ICs on the wafer of FIG. 3 are smaller than the ICs on the wafer of FIG. 4. The wafer area shown in FIG. 3 contains 100 identical ICs and the wafer area shown in FIG. 4 contains 4 identical ICs. There may be other differences in device characteristics between the ICs on the wafer of FIG. 3 and the ICs on the wafer of FIG. 4. As a consequence, the power and signal needs of the two wafers will be different.

In a preferred embodiment of the invention, the tester 100 tests multiple DUTs. In FIG. 3, a small portion of the tester 100 is shown as testing a 300 mm wafer containing 60,000 identical ICs of which 100 are shown. In FIG. 4, the tester 100 is shown as testing a 300 mm wafer containing 2400 identical ICs of which 4 are shown. The wafer bump configurations of these two wafers are identical. Therefore, a common fixture is used to test both of these wafers.

In general, a common fixture may be used to test wafers containing ICs of different types, so long as the wafers employ the same wafer bump configuration. Wafers can be configured to have the same bump configuration, because bump technology has no dependence on underlying device characteristics. The bumps are applied to the wafer in a series of manufacturing steps. This series of steps does not depend on the circuits being "bumped." In order to employ a common fixture for different types of wafers, the bumps on the wafer are applied in view of the common fixture's layout so that they are aligned with the output lines on the fixture and connect to all of the test circuits and power grids that are used in testing the devices on the wafer.

In FIG. 3, 100 ICs, each with 16 bumps, are shown. During test, each IC is connected to the tester 100 by a single pair of wires, but for simplicity only ten pairs of these connections are shown. Because each IC is connected to the tester by only a single pair of wires, the wires are used for both simultaneous bidirectional signaling and power transmission. Therefore, in the example of FIG. 3, each IC has the internal circuit design of the DUT 200 shown in FIG. 1, and the bumps are applied to the wafer so that during test the power grid and the transceiver of each IC are connected to the tester 100 through that IC's corresponding pair of wires.

On the tester side, each pair of wires is connected to a power supply 120 and a transceiver 130 as shown in FIG. 1. The power supplies 120 are housed in one or more test instruments 170 and the transceivers are housed in one or more test instruments 170. The fixture 190 is configured to provide the decoupling between the power and test signals (e.g., provision of inductors 150, 151 and capacitors 160, 161) that is shown in FIG. 1.

In FIG. 4, 4 ICs, each with 400 bumps, are shown. The fixture 190 that is designed for the wafer of FIG. 3 is also used to connect the wafer of FIG. 4 to the tester 100. As in FIG. 3, there are 100 pairs of wires connecting the tester 100 and the wafer being tested. Each IC in FIG. 4 has 25 pairs of wires connecting it to the tester 100, but for simplicity only 5 pairs of wires are shown for IC 401 and IC 402. Because each IC is connected to the tester 100 by multiple pairs of wires, depending on the IC design, one or more pairs of wires may be designated to only transmit power (see FIG. 5A), and one or more pairs of wires may be designated to only transmit test and response signals (see FIG. 5B). Also, one or more pairs of wires may be designated to transmit both power and test/response signals (see FIG. 1), or neither power nor test/response signals (see FIG. 5C).

Figure 5A:
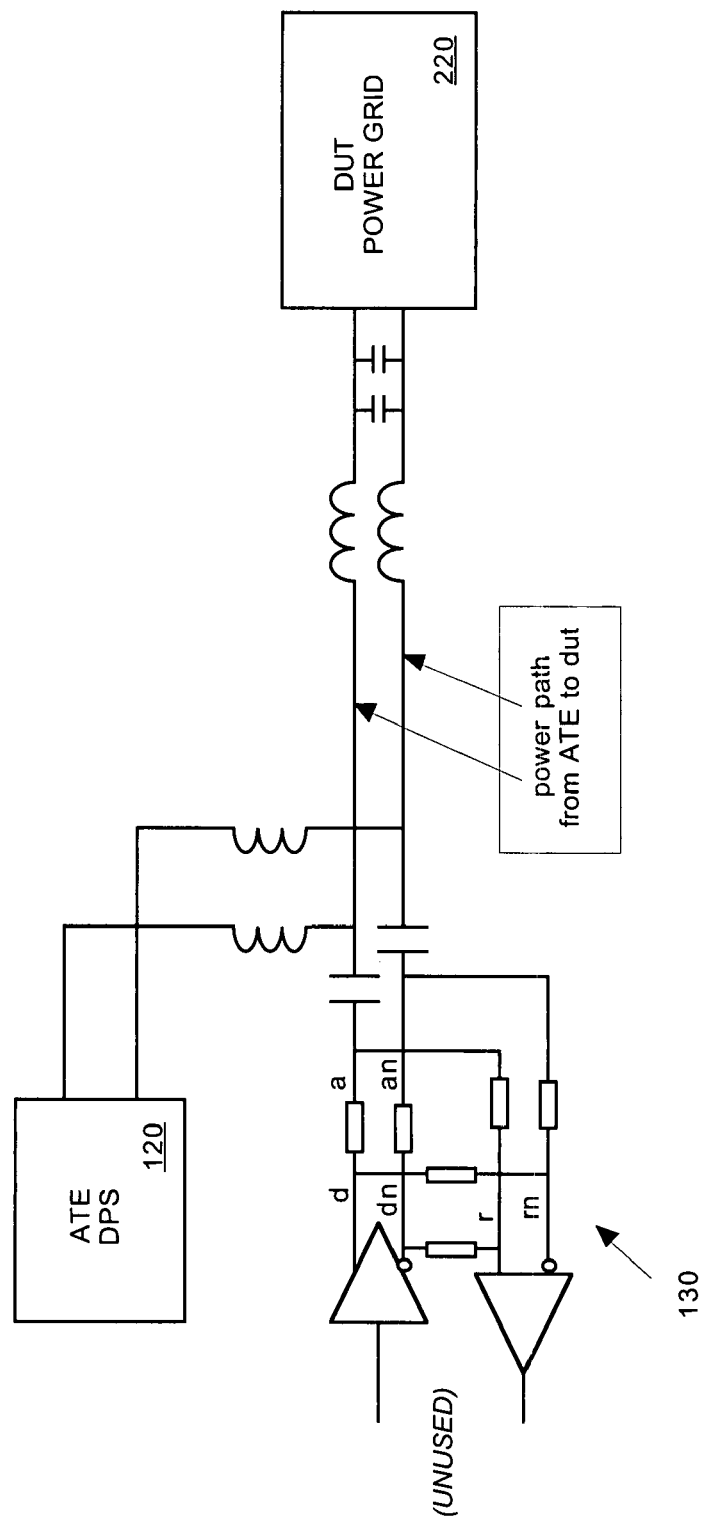
FIG. 5A is a block diagram showing a connection between a tester and a DUT over which only power is transmitted.
Figure 5B:
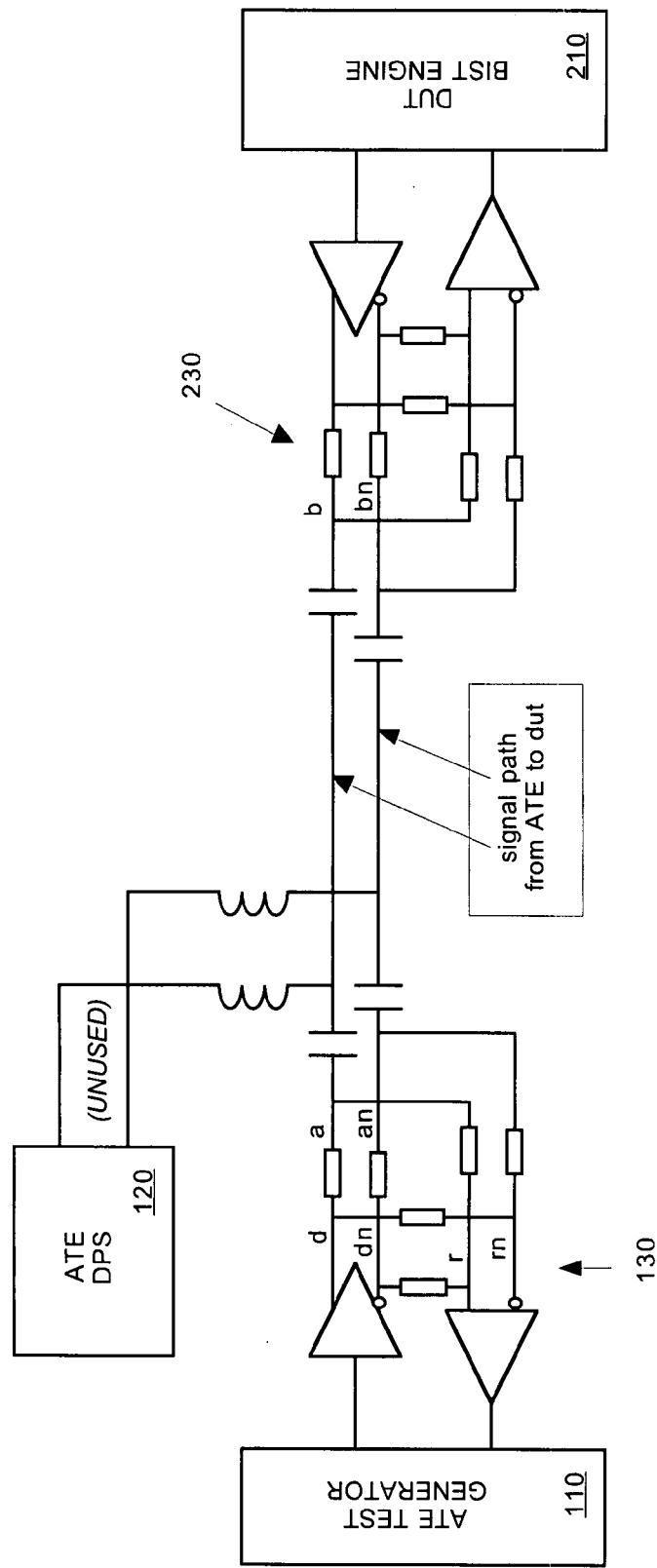
FIG. 5B is a block diagram showing a connection between a tester and a DUT over which only test/response signals are transmitted.
Figure 5C:
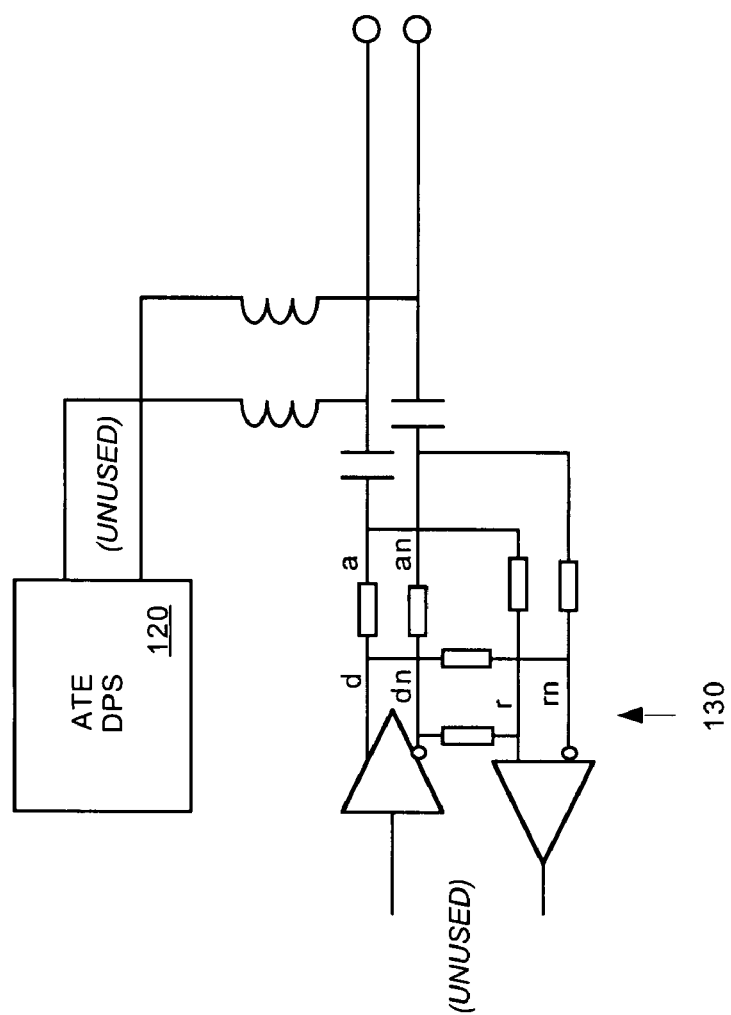
FIG. 5C is a block diagram showing a connection between a tester and a DUT over which neither power nor test/response signals are transmitted.

The designation is carried out under the control of the test program and is dependent on what components of the IC that the wires are connected to. If the wires are connected to a power grid 220 of the IC as shown in FIG. 5A, the wires are designated to only transmit power. If the wires are connected to a BIST engine 210 of the IC through a transceiver 230 as shown in FIG. 5B, the wires are designated to only transmit test and response signals. If the wires are connected to both the power grid 220 and the BIST engine 210 through a transceiver 230, as shown in FIG. 1, the wires are designated to transmit both power and test/response signals. The remaining wires are designated to transmit neither power nor test/response signals as shown in FIG. 5C.

For clarity, the following specific example is provided in connection with the wafer of FIG. 4. In this example, it is assumed that each IC that is being tested requires power supplied to nine power grids, and test signals supplied to four BIST engines through corresponding transceivers. Because there are 25 available pairs of connections for each IC and only 13 pairs of connections are necessary to test one IC, it is determined that nine pairs of wires will be used for supplying power and four pairs of wires will be used for transmitting test/response signals. Twelve pairs of wires will be unused. The bumps are applied to the IC with the desired connections in mind so that, after the wafer is attached to the tester 100 for testing, nine pairs of wires are connected to the power grid of the IC and four pairs of wires are connected to the BIST engine through corresponding transceivers, while twelve pairs of wires are left open.

In another example, the tester 100 has all of the test transceivers contained in twenty-five instruments, each having two thousand transceivers. The tester 100 has all of the power supplies contained in ten instruments, each having two hundred power supplies. All of the power supplies are ganged and then distributed to the DUTs. In this example, the individual signal pairs are connected to fifty thousand (25×2000=50,000) individual sites directly, while each power supply is distributed to twenty-five signal pairs in parallel. The power distribution and a technique for disconnecting power connection to one or more of the DUTs are described in "Simultaneous Bidirectional Test Data Flow for a Low-cost Wafer Test Strategy," ITC 2003 General Proceedings (2003), the contents of which are incorporated by reference herein.

While the foregoing is directed to embodiments of the present invention, other and further embodiments of the invention may be devised without departing from the basic scope thereof, and the scope thereof is determined by the claims that follow.

The invention claimed is:

1. An apparatus for testing electronic devices, comprising:
  a test module having a transceiver, coupled to a pair of bidirectional conductive lines comprising a first line and a second line, for supplying test signals to an electronic device to be tested through said pair of bidirectional conductive lines and for receiving response signals from said electronic device over said pair of bidirectional conductive lines;
  a power source, coupled to said pair of bidirectional conductive lines, for supplying power to a power grid of said electronic device through said pair of bidirectional conductive lines, wherein test signals and power source signals are supplied separately;
  a circuit, coupled to said pair of bidirectional conductive lines, wherein said circuit is operable to couple said power source to said power grid of said electronic device, and wherein said circuit is operable to couple said test module to said electronic device, and wherein said circuit is operable to provide test signals to a portion of said electronic device separate from said power grid, and wherein said circuit is operable to provide power source signals to said power grid.

2. The apparatus according to claim 1, further comprising additional pairs of conductive lines, wherein said test module includes additional transceivers, each of which is coupled to a different one of said additional pairs of conductive lines, and wherein said power source is coupled to each of said additional pairs of conductive lines.

3. The apparatus according to claim 2, wherein each transceiver is coupled to its corresponding pair of conductive lines through a pair of capacitors.

4. The apparatus according to claim 1, wherein said power source is connected to said first line through a first inductor and to said second line through a second inductor.

5. The apparatus according to claim 4, wherein the conductive path between the transceiver and said pair of conductive lines does not include the first inductor or the second inductor and the conductive path between the power source and said pair of conductive lines does not include said first decoupling device.

6. The apparatus according to claim 1, wherein the transceiver is configured to receive differential input signals through said pair of conductive lines and to supply differential output signals onto said pair of conductive lines.

7. The apparatus accordingly to claim 1, wherein said first decoupling device comprises a first inductor and a second inductor.

8. The apparatus according to claim 7, further comprising additional pairs of conductive lines, wherein said test module includes additional transceivers, each of which is coupled to a different one of said additional pairs of conductive lines, and wherein said power source is coupled to each of said additional pairs of conductive lines.

9. The apparatus according to claim 8, wherein said power source is coupled to each pair of conductive lines through a pair of inductors.

10. The apparatus according to claim 7, wherein the transceiver is configured to receive differential input signals through said pair of conductive lines and to supply differential output signals onto said pair of conductive lines.

11. The apparatus according to claim 1, wherein said first decoupling device comprises a first capacitor and a second capacitor.

12. A method of testing electronic devices, comprising:
  supplying test signals to an electronic device under test through a pair of bidirectional conductive lines comprising a first line and a second line;
  receiving response signals from said electronic device under test over said pair of bidirectional conductive lines; and
  supplying power to a power grid of said electronic device under test through said pair of bidirectional conductive lines, wherein test signals and power source signals are supplied separately.

13. The method as described in claim 12 further comprising:
  supplying test signals to said electronic device under test through additional pairs of bidirectional conductive lines, wherein a power source for supplying said power is coupled to each of said additional pairs of conductive lines.

14. The method as described in claim 12, wherein each test module for supplying test signals is coupled to its corresponding pair of conductive lines through a pair of capacitors.

15. The method as described in claim 12, wherein a power source for supplying said power to said power grid is coupled to said first line through a first inductor and to coupled to said second line through a second inductor.

16. The method as described in claim 15, wherein the conductive path between a test module supplying said test signals and said pair of conductive lines does not include said first inductor or said second inductor.

17. The method as described in claim 12 further comprising:

receiving differential input signals through said pair of conductive lines; and supplying differential output signals onto said pair of conductive lines.

\* \* \* \* \*